(12) United States Patent
Handa et al.

(10) Patent No.: US 11,943,947 B2
(45) Date of Patent: Mar. 26, 2024

(54) LIGHT-EMITTING DEVICE AND METHOD OF MANUFACTURING LIGHT-EMITTING DEVICE

(71) Applicant: SHARP KABUSHIKI KAISHA, Sakai (JP)

(72) Inventors: Shinichi Handa, Sakai (JP); Noboru Iwata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 487 days.

(21) Appl. No.: 17/280,887

(22) PCT Filed: Sep. 28, 2018

(86) PCT No.: PCT/JP2018/036380
§ 371 (c)(1),
(2) Date: Mar. 27, 2021

(87) PCT Pub. No.: WO2020/065944
PCT Pub. Date: Apr. 2, 2020

(65) Prior Publication Data
US 2022/0006035 A1    Jan. 6, 2022

(51) Int. Cl.
*H10K 50/15*     (2023.01)
*H10K 50/115*    (2023.01)
*H10K 50/16*     (2023.01)
*H10K 71/00*     (2023.01)
*H10K 102/10*    (2023.01)

(52) U.S. Cl.
CPC ........... *H10K 50/15* (2023.02); *H10K 50/115* (2023.02); *H10K 50/16* (2023.02); *H10K 71/00* (2023.02); *H10K 2102/102* (2023.02)

(58) Field of Classification Search
CPC ......... H10K 50/115; H10K 50/14–167; H10K 2101/80
See application file for complete search history.

(56) References Cited

U.S. PATENT DOCUMENTS

| | | |
|---|---|---|
| 2007/0103068 A1 | 5/2007 | Bawendi et al. |
| 2012/0238047 A1 | 9/2012 | Bawendi et al. |
| 2012/0292595 A1 | 11/2012 | Bawendi et al. |
| 2017/0125635 A1 | 5/2017 | Bawendi et al. |

FOREIGN PATENT DOCUMENTS

| | | | |
|---|---|---|---|
| JP | 2010-055900 A | 3/2010 | |
| JP | 2010055900 A * | 3/2010 | ............. H10K 50/00 |
| JP | 2012-023388 A | 2/2012 | |
| JP | 2018-046219 A | 3/2018 | |
| WO | 2006/088877 A1 | 8/2006 | |

* cited by examiner

Primary Examiner — Daniel P Shook
(74) Attorney, Agent, or Firm — ScienBiziP, P.C.

(57) ABSTRACT

A light-emitting device includes: an anode; a cathode; a light-emitting layer between the anode and the cathode; and a hole transport layer between the anode and the light-emitting layer, the hole transport layer containing carbon and a metal oxide in a prescribed, adjusted ratio.

20 Claims, 3 Drawing Sheets

LIGHT-EMITTING DEVICE AND METHOD OF MANUFACTURING LIGHT-EMITTING DEVICE

TECHNICAL FIELD

The disclosure relates to light-emitting devices and methods of manufacturing light-emitting devices.

BACKGROUND ART

Patent Literature 1 discloses technology that achieves long device life on a light-emitting device containing semiconductor nanocrystals (quantum dots or QDs) by including a metal oxide-containing hole transport layer (HTL).

CITATION LIST

Patent Literature

Patent Literature 1
    Japanese Unexamined Patent Application Publication, Tokukai, No. 2012-23388

SUMMARY OF INVENTION

Technical Problem

This light-emitting device however may in some cases exhibit insufficient luminance and/or luminous efficiency due to possible quenching of excitons by the metal oxide HTL.

The disclosure, in view of these issues, has an object to, for example, provide a light-emitting device with improved luminance and luminous efficiency over comparative examples.

Solution to Problem

The disclosure is directed to a light-emitting device including: an anode; a cathode; a light-emitting layer between the anode and the cathode; and a hole transport layer between the anode and the light-emitting layer, the hole transport layer containing carbon and a metal oxide in a prescribed, adjusted ratio.

The disclosure is also directed to a method of manufacturing a light-emitting device, the method including: forming an anode; forming a hole transport layer on the anode, the hole transport layer containing carbon and a metal oxide in a prescribed, adjusted ratio; and forming at least a light-emitting layer and a cathode in this sequence on the hole transport layer.

Advantageous Effects of Disclosure

These structures enable provision of a light-emitting device with improved luminance and luminous efficiency.

DESCRIPTION OF EMBODIMENTS

The following will describe embodiments of the disclosure with reference to drawings. The disclosure may be implemented in various forms without departing from its spirit and main features. Therefore, the following embodiments and examples are for illustrative purposes only in every respect and should not be subjected to any restrictive interpretations.

EMBODIMENTS

Figure 1:
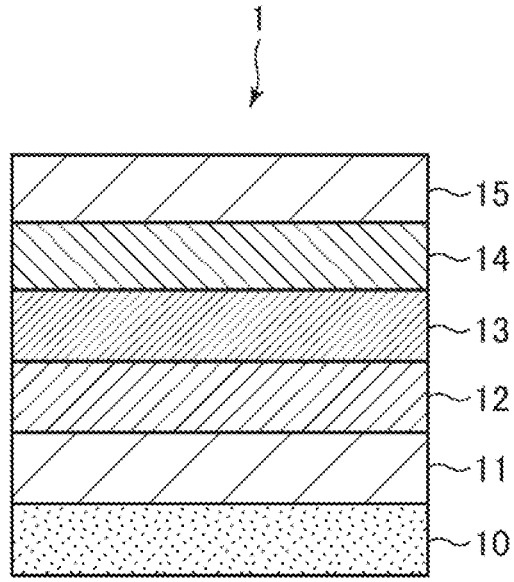
FIG. 1 is a schematic diagram of an exemplary cross-sectional structure of a light-emitting device in accordance with an embodiment of the disclosure.

FIG. 1 is a schematic diagram of an exemplary cross-sectional structure of a light-emitting device in accordance with an embodiment of the disclosure.

Referring to FIG. 1, a light-emitting device 1 includes a substrate 10, an anode 11, a hole transport layer 12, a light-emitting layer 13, an electron transport layer 14, and a cathode 15 in this sequence when viewed from the lower layer. The anode 11 resides on the substrate 10 and is electrically connected to a TFT (not shown) on the substrate 10. Throughout the following description, the direction from the substrate 10 toward the light-emitting layer 13 will be referred to as the upward direction whereas the direction from the light-emitting layer 13 toward the substrate 10 will be referred to as the downward direction. The present embodiment assumes that the light-emitting device 1 is a bottom-emission type where the light-emitting layer 13 emits light that exits the light-emitting device 1 downward. The light-emitting layer 13 is composed of quantum dots and may alternatively be composed of an organic light-emitting material.

The substrate 10 is made of, for example, glass or flexible resin such as polyimide and is highly transparent. When the light-emitting device 1 is a top-emission type where the light-emitting layer 13 emits light that exits the light-emitting device 1 upward, the substrate 10 may be made of, for example, plastics and poorly transparent.

The anode 11 is composed of a conductive material that has a large work function (e.g., roughly equivalent to the valence band of the hole transport layer 12) such as tin-doped indium oxide (ITO), zinc-doped indium oxide (IZO), aluminum-doped zinc oxide (AZO), gallium-doped zinc oxide (GZO), antimony-doped tin oxide (ATO), or fluorine-doped tin oxide (FTO). The anode 11 is transparent. The anode 11 is formed by, for example, sputtering, vapor deposition, or printing.

The hole transport layer 12 transports holes fed from the anode 11 to the light-emitting layer 13. The hole transport layer 12 contains a metal oxide and carbon atoms in a prescribed, adjusted ratio.

The term, "metal oxide," in the present specification is used in a broad sense of the term, referring to oxides of metals including insulating oxides, conductive oxides (including transparent conductive oxides), and semiconducting oxides. The term, "ratio" or "content ratio," in the present specification refers to the ratio of the carbon atom content of the hole transport layer 12 to the metal atom content of the hole transport layer 12 (carbon atoms/metal atoms) and is expressed in percent.

The metal oxide in the hole transport layer 12 is produced by dissolving, for example, a metal oxide precursor such as an organic acid salt of a metal or a metal complex of an organic compound in a solvent to prepare a coating solution, applying the coating solution to the anode 11, and then baking the solution in an atmosphere of oxygen, nitrogen, argon, or a mixture thereof. In this example, the carbon atoms in the hole transport layer 12 are contained, for example, in the metal oxide precursor that remains after the baking.

The solvent in which the metal oxide precursor is dissolved in the example is, for example, an ethanol-based organic solvent. The coating solution can be applied by any method and may be applied by, for example, spin-coating. The hole transport layer 12 has a thickness of, for example, 5 to 100 nm.

The metal oxide in the hole transport layer 12 may be produced by preparing a dispersion solution containing metal oxide nanoparticles dispersed in a solvent such as ethanol, applying the dispersion solution to the anode 11 by spin-coating, and evaporating and drying out the solvent. The metal oxide nanoparticles are synthesized in advance from, for example, a metal oxide precursor such as an organic acid salt of a metal or a metal complex of an organic compound in such a manner that the resultant metal oxide nanoparticles contain carbon atoms in a prescribed, adjusted ratio.

The metal oxide in the example is composed primarily of, for example, NiO, $LaNiO_3$, $Cr_2O_3$, $Ni_{1-x}Mg_xO$ ($0.0<x\leq0.9$), or $Cu_2O$. The metal oxide may additionally contain an oxide of, for example, Li, Ni, Cu, Mg, Al, or Ti in 20% or less, to increase the hole transport efficiency from the hole transport layer 12 to the light-emitting layer 13.

The metal oxide precursor in the example is, for example, a substance capable of producing, for example, an amorphous or crystalline thin film of metal oxide. Specifically, as an example, when the metal oxide is NiO, the metal oxide precursor is, for example, nickel acetate or nickel acetylacetonate.

The prescribed carbon content ratio of the hole transport layer 12 is preferably 1.2% or higher as achieved, for example, by the common 400° C. baking described in WO2016/136729. If the carbon content ratio is 1.2% or lower, for example, many excitons are quenched by the hole transport layer 12, possibly leading to low luminance and luminous efficiency. The prescribed carbon content ratio is preferably less than 23.8% as achieved by 180° C. baking. If the carbon content ratio is 23.8% or higher, for example, no metal oxide may be produced, possibly leading to no current flow in the light-emitting device 1. Furthermore, to obtain the light-emitting device 1 that achieves high luminance and high luminous efficiency at low voltage, the prescribed carbon content ratio is more preferably from 1.5% to 6.0%, both inclusive, as achieved by 330° C. baking and 200° C. baking respectively and even more preferably from 2.1% to 4.2%, both inclusive, as achieved by 280° C. baking and 230° C. baking respectively, as will be demonstrated later in examples.

The hole transport layer 12 may have a carbon concentration that is constant in a thickness direction thereof. This particular structure, for example, enables the hole transport layer 12 to achieve a good balance across the thickness thereof between the N O's function of increasing hole transport efficiency and the carbon's function of restraining exciton quenching. The structure hence further improves the luminance and luminous efficiency of the light-emitting device 1.

The hole transport layer 12 may have a carbon concentration that increases toward the light-emitting layer 13. This particular structure, for example, imparts, to the hole transport layer 12, a carbon content that increases toward the light-emitting layer 13, thereby increasingly better restraining exciton quenching as moving toward the light-emitting layer 13 where excitons are likely to be quenched and also imparts, to the hole transport layer 12, a NiO content that increases farther from the light-emitting layer 13, thereby achieving increasingly higher hole transport efficiency as moving away from the light-emitting layer 13. The structure hence more effectively improves the luminance and luminous efficiency of the light-emitting device 1. This particular hole transport layer 12 in the example can be formed by, for example, repeating the film-forming process from the application of a solution through the baking with the baking temperature being lowered toward the upper layer (as moving toward the light-emitting layer 13).

The light-emitting layer 13 is where the holes transported from the anode 11 recombine with the electrons transported from the cathode 15 to emit light. The light-emitting layer 13 can be composed of quantum dots and contain, for example, from one to several layers of quantum dots. The light-emitting layer 13 may be formed from a dispersion solution, for example, by spin-coating or inkjet printing. The dispersion solution contains quantum dots dispersed, for example, in a solvent such as hexane or toluene. The dispersion solution may additionally contain thiol or amine dispersed in the solvent. The light-emitting layer 13 has a thickness of, for example, 5 to 80 nm.

The quantum dots may be made of, for example, semiconducting nanoparticles with a core/shell structure, such as CdSe/ZnS, CdSe/CdS, InP/ZnS, ZnSe/ZnS, or CIGS/ZnS nanoparticles.

The quantum dots have a particle diameter of, for example, 3 to 15 nm. The emission wavelength of the quantum dots can be controlled by way of the particle diameter of the quantum dots. Therefore, the wavelength of the light emitted by the light-emitting device 1 can be controlled through the control of the particle diameter of the quantum dots.

The electron transport layer 14 transports the electrons fed from the cathode 15 to the light-emitting layer 13. The electron transport layer 14 may be made of a material such as ZnO, $Zn_{1-x}Mg_xO$ ($0.0<x\leq0.5$), $TiO_2$, $SnO_2$, $Ta_2O_3$, or $SrTiO_3$. The electron transport layer 14 may be formed by applying a dispersion solution containing nanoparticles dispersed in a solvent such as ethanol to the light-emitting layer 13 by, for example, spin-coating or sputtering and then evaporating and drying out the solvent. The electron transport layer 14 has a thickness of, for example, 10 to 100 nm.

Each of the hole transport layer 12 and the electron transport layer 14 may be nanoparticulate, crystalline, polycrystalline, or amorphous. The hole transport layer 12 may have a function of disrupting electron transport, whereas the electron transport layer 14 may have a function of disrupting hole transport. The hole transport layer 12 and the electron transport layer 14 preferably have an absorption coefficient of 10 $cm^{-1}$ or less for the light emitted by the light-emitting layer 13, so as not to disrupt the emission of light by the light-emitting device 1.

The cathode 15 is composed of a conductive metal that has a small work function (e.g., roughly equivalent to the conduction band of the electron transport layer 14) such as Al, Ag, Ba, Yb, Ca, a Li—Al alloy, a Mg—Al alloy, a Mg—Ag alloy, a Mg—In alloy, or an Al—$Al_2O_3$ alloy. The cathode 15 is reflective. The cathode 15 is formed by, for example, sputtering, vapor deposition, or printing.

The present embodiment, for example, restrains exciton quenching in a light-emitting device including a hole transport layer containing a metal oxide, thereby improving the luminance and luminous efficiency of the light-emitting device.

The disclosure is not limited to the embodiments described above and may be implemented in various other forms. The disclosure may further include, for example, a configuration that is practically the same as the configuration detailed above, a configuration that achieves the same effect and function as the configuration detailed above, or a configuration that achieves the same purpose as the configuration detailed above.

For example, the hole transport layer 12 has been described as containing a metal oxide and carbon atoms as an example. The disclosure may be applied to the electron transport layer 14. Specifically, the metal oxide may be any of ZnO, $Zn_{1-x}Mg_xO(0.0<x\leq0.5)$, $TiO_2$, $SnO_2$, $Ta_2O_3$, and $SrTiO_3$. In such cases, the electron transport layer 14 can achieve the same effects as the hole transport layer 12 in the relation to the carbon/metal atomic ratio.

In these cases, the substrate 10, the cathode 15, the electron transport layer 14, the light-emitting layer 13, the hole transport layer 12, and the anode 11 are preferably stacked in this sequence. The metal oxide in the electron transport layer 14 may be produced, for example, by dissolving a metal oxide precursor such as an organic acid salt of a metal or a metal complex of an organic compound in a solvent to prepare a coating solution, applying the coating solution to the cathode 15, and then baking the solution in an atmosphere of oxygen, nitrogen, argon, or a mixture thereof. The light-emitting layer 13 is protected from damage in the baking because the light-emitting layer 13 is formed after the electron transport layer 14 is formed.

The metal oxide in the electron transport layer 14 may be produced by preparing a dispersion solution containing metal oxide nanoparticles dispersed in a solvent such as ethanol, applying the dispersion solution to the cathode 15 by spin-coating, and evaporating and drying out the solvent. The metal oxide nanoparticles are synthesized in advance from, for example, a metal oxide precursor such as an organic acid salt of a metal or a metal complex of an organic compound in such a manner that the resultant metal oxide nanoparticles contain carbon atoms in a prescribed, adjusted ratio.

Similarly to the hole transport layer 12, the electron transport layer 14 may have a carbon concentration that is constant in a thickness direction thereof and may have a carbon concentration that increases toward the light-emitting layer 13. These particular structures improve the luminance and luminous efficiency of the light-emitting device 1, similarly to the hole transport layer 12.

Figure 2:
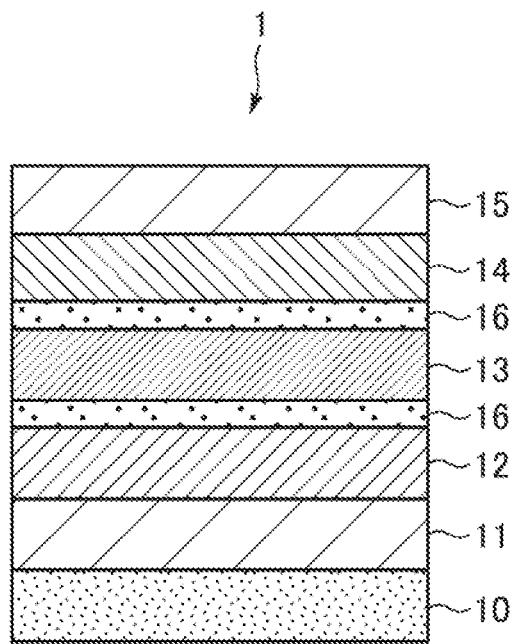
FIG. 2 is a schematic diagram of an exemplary cross-sectional structure of a light-emitting device in accordance with a variation example of an embodiment of the disclosure.

The light-emitting device 1 may further include an electrical insulation film 16 between the hole transport layer 12 and the light-emitting layer 13 and another electrical insulation film 16 between the light-emitting layer 13 and the electron transport layer 14, as shown in FIG. 2. The electrical insulation film 16 may be made of a material such as $Al_2O_3$, $SiO_2$, MgO, or $ZrO_2$. $Al_2O_3$ is particularly preferred because $Al_2O_3$ can be easily processed, and can be uniformly formed at low temperature by sputtering or another conventional method. The two electrical insulation films 16 may not be made of the same material. The electrical insulation film 16 has a thickness of, for example, 1 nm to 3 nm. The electrical insulation film 16 may be provided only either between the hole transport layer 12 and the light-emitting layer 13 or between the light-emitting layer 13 and the electron transport layer 14. The disclosure, involving use of a metal oxide and carbon atoms, may be applied to the electrical insulation film 16. The use of the electrical insulation film 16, for example, restrains quenching when holes and electrons are recombined, thereby further improving luminance.

FIGS. 1 and 2 show, as an example, a structure where the lower electrode serves as the anode and the upper electrode serves as the cathode. The disclosure may alternatively be applied to a structure where the lower electrode serves as the cathode and the upper electrode serves as the anode, in which case the substrate 10, the cathode 15, the electron transport layer 14, the light-emitting layer 13, the hole transport layer 12, and the anode 11 are stacked in this sequence.

EXAMPLES OF THE INVENTION DISCLOSURE

The following will describe the disclosure in more detail by way of examples and with reference to drawings. The disclosure is not limited to these examples.

Manufacture of Light-Emitting Device

The present example assumes that the lower electrode serves as the anode and the upper electrode serves as a cathode, in which structure the substrate 10, the anode 11, the hole transport layer 12, the light-emitting layer 13, the electron transport layer 14, and the cathode 15 are stacked in this sequence. This structure includes no electrical insulation films and may alternatively include an electrical insulation film. The present example may alternatively assume that the lower electrode serves as the cathode and the upper electrode serves as the anode, in which structure the substrate 10, the cathode 15, the electron transport layer 14, the light-emitting layer 13, the hole transport layer 12, and the anode 11 are stacked in this sequence.

The light-emitting devices in accordance with Examples 1 and 2 and Comparative Examples 1 and 2 all detailed below differ only in the structure of the hole transport layer 12 and are otherwise identical.

The substrate 10 was a glass substrate. The anode 11 was formed of IZO by sputtering to a thickness of 100 nm. The light-emitting layer 13 contained Cd (Se, S) quantum dots and had a thickness of 40 nm. The electron transport layer 14 was formed by applying ZnO nanoparticles to a thickness of 40 nm. The cathode 15 was formed of Al by vacuum vapor deposition to a thickness of 100 nm. Each layer was sealed in a nitrogen atmosphere after being formed.

The hole transport layer 12 was made of NiO for desirable properties thereof such as atmospheric stability and light transmission. In Example 1, the hole transport layer 12 was formed by dissolving nickel acetate in ethanol to prepare a coating solution, applying the coating solution to the anode 11 by spin-coating, and then baking the coating solution at 230° C. for 1 hour in an oxygen atmosphere.

The hole transport layers 12 of Example 2 and Comparative Examples 1 and 2 differed from Example 1 only in the baking temperature and were otherwise formed under the same conditions as Example 1. The baking temperature was 280° C., 180° C., and 400° C. in Example 2 and Comparative Examples 1 and 2 respectively. The baking temperature in Comparative Example 2 was 400° C. which is, as described earlier, a baking temperature commonly used in baking NiO paste to obtain a NiO layer.

XSPXPS ANALYSIS

The hole transport layers 12 thus obtained were analyzed by X-ray photoelectron spectroscopy (XPS). Specifically, the elements in the hole transport layers 12 were analyzed using an X-ray photoelectron spectrometer (Kratos AXIS NOVA, manufactured by Shimadzu Corporation) (X-ray: AlK alpha beam, output: 10 mA×15 kV). Specifically, the ratio (C/Ni) of element concentrations (atom %) of nickel atoms and carbon atoms was calculated from the detection sensitivity factor and the area of each peak in the spectrum obtained by the XPS measurement. The background for the quantification calculation was determined by the Shirley method.

The analysis shows that the hole transport layer 12 had a carbon/nickel (C/Ni) composition ratio (atomic ratio) of 4.2% in Example 1, 2.1% in Example 2, 23.8% in Comparative Example 1, and 1.2% in Comparative Example 2.

Figure 3:
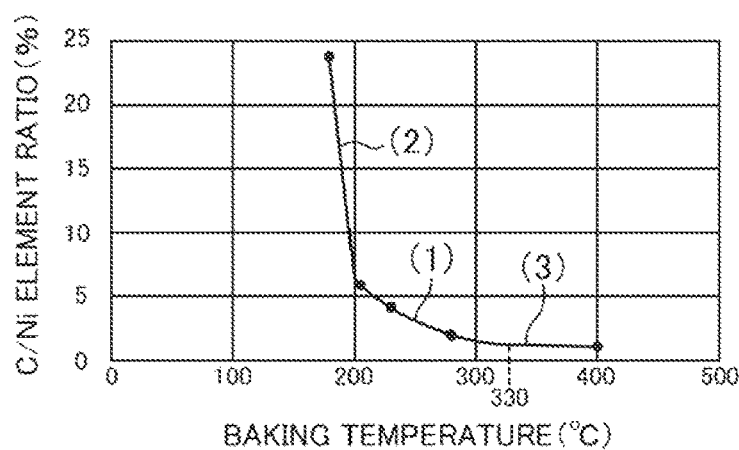
FIG. 3 is a diagram of plots of C/Ni element ratio versus baking temperature.

Table 1 represents results of the analysis of the composition of the hole transport layers 12 of Examples 1 and 2 and Comparative Examples 1 and 2. FIG. 3 represents the C/Ni element ratio plotted against the baking temperature.

TABLE 1

XPS Composition Analysis

|  | Baking Temperature (° C.) | C/Ni Ratio (%) |
| --- | --- | --- |
| Comparative Example 1 | 180 | 23.8 |
| ********* | 205 | 5.9 |
| Example 1 | 230 | 4.2 |
| Example 2 | 280 | 2.1 |
| Comparative Example 2 | 400 | 1.2 |

The graph in FIG. 3, obtained by linking the plots with a generally arc-like curve, indicates that the C/Ni element ratio increases abruptly below 200° C. and is constant above 330° C.

These results suggest that the light-emitting device including the hole transport layer formed at a baking temperature in a range from 200° C. (C/Ni element ratio: approximately 6.0%) to 330° C. (C/Ni element ratio: approximately 1.5%), which encompasses both the baking temperatures in Example 1 and Example 2, has substantially the same effects as the light-emitting devices 1 of Examples 1 and 2.

Evaluation

Figure 4:
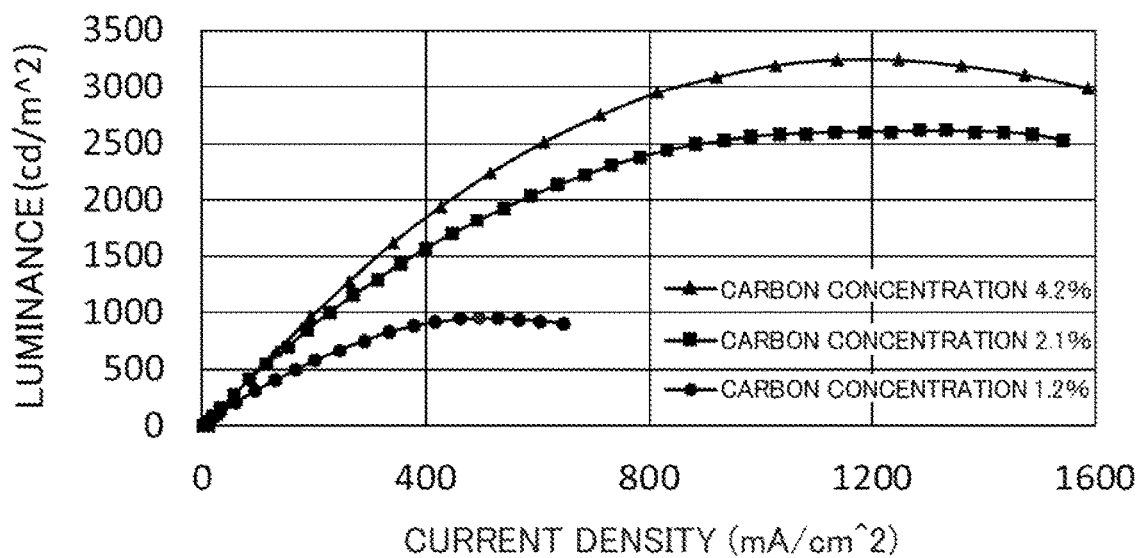
FIG. 4 shows measurements of current density-luminance characteristics in examples of the disclosure.
Figure 5:
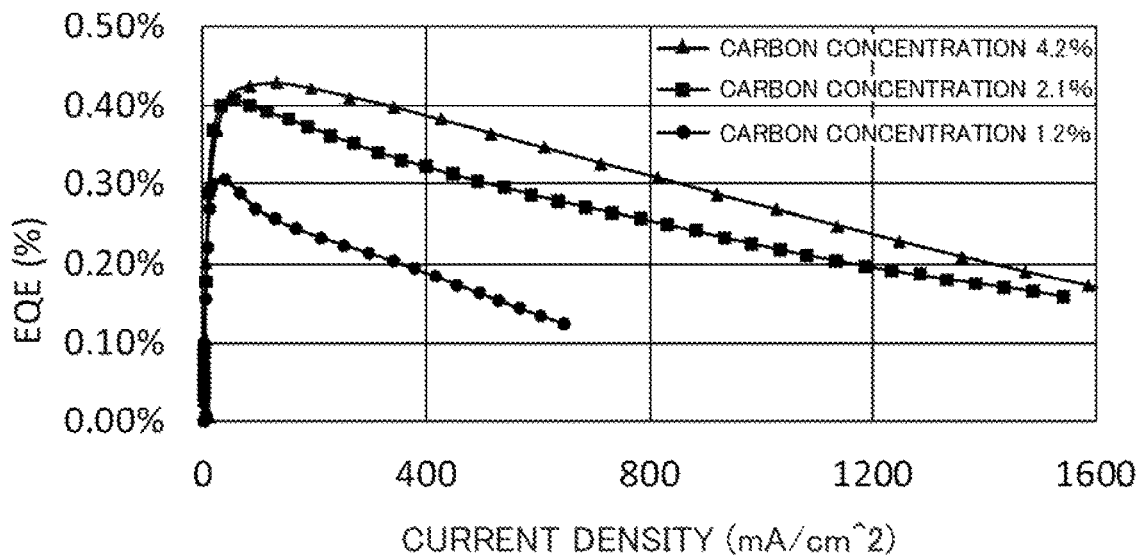
FIG. 5 shows measurements of current density-external quantum efficiency (EQE) characteristics in examples of the disclosure.
Figure 6:
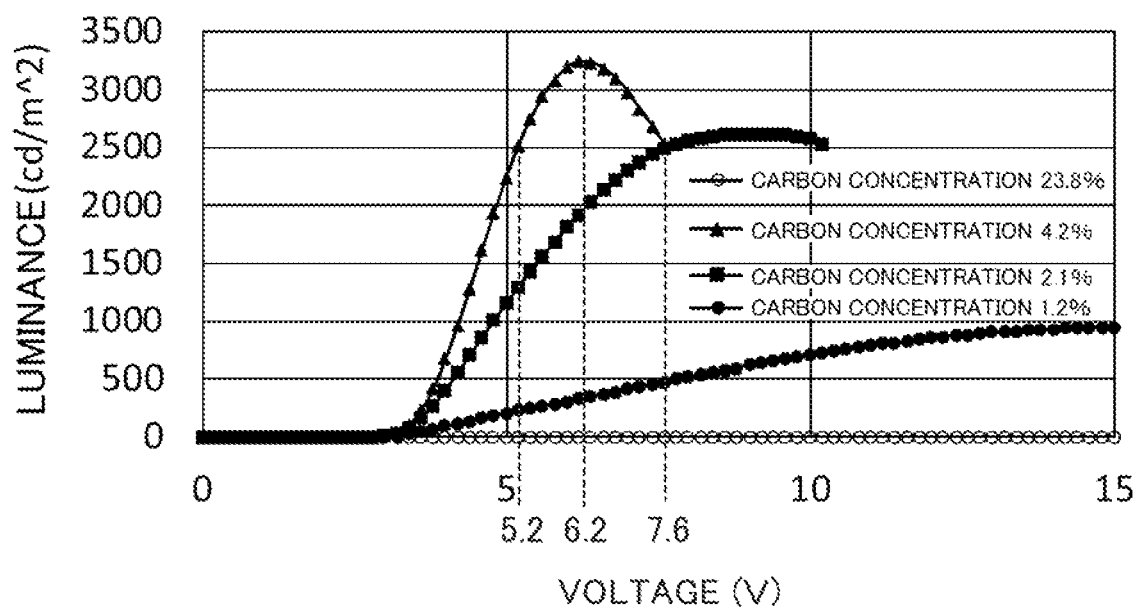
FIG. 6 shows measurements of voltage-luminance characteristics in examples of the disclosure.
Figure 7:
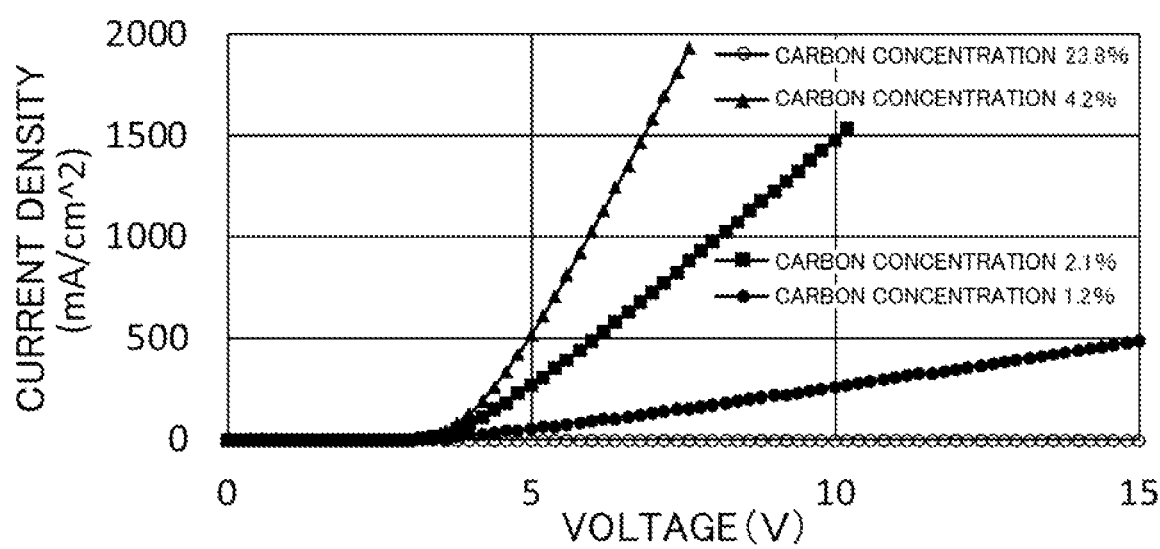
FIG. 7 shows measurements of voltage-current density characteristics in examples of the-disclosure.

The current density-luminance characteristics, current density-external quantum efficiency (EQE) characteristics, voltage-luminance characteristics, and voltage-current density characteristics of the light-emitting devices of Examples 1 and 2 and Comparative Examples 1 and 2 were measured. FIG. 4 represents the current density-luminance characteristics. FIG. 5 represents the current density-external quantum efficiency (EQE) characteristics. FIG. 6 represents the voltage-luminance characteristics. FIG. 7 represents the voltage-current density characteristics.

FIG. 4 shows the current density (mA/cm$^2$) on the horizontal axis and the luminance (cd/m$^2$) on the vertical axis. FIG. 4 indicates that, for example, the luminance at a current density near 400 mA/cm$^2$ is approximately 1,800 cd/m$^2$ in the light-emitting device of Example 1 and approximately 1,550 cd/m$^2$ in the light-emitting device of Example 2. These values are very high in comparison with the luminance of approximately 900 cd/m$^2$ in the light-emitting device of Comparative Example 2. The graph does not show the results obtained from the light-emitting device of Comparative Example 1 because no current flowed in the light-emitting device of Comparative Example 1 and no points except for (0,0) could be plotted. The results obtained from the light-emitting device of Comparative Example 1 were treated in the same manner in FIG. 5 described next. No current flowed in the light-emitting device of Comparative Example 1 presumably because no NiO could be produced in the baking at 180° C.

FIG. 5 shows the current density (mA/cm$^2$) on the horizontal axis and the EQE (%) on the vertical axis. FIG. 5 indicates that, for example, the EQE at a current density near 400 mA/cm$^2$ is approximately 0.39% in the light-emitting device of Example 1 and approximately 0.32% in the light-emitting device of Example 2. These values represent very high luminous efficiency in comparison with the EQE of approximately 0.19% in the light-emitting device of Comparative Example 2.

FIG. 6 shows the applied voltage (V) on the horizontal axis and the luminance (cd/m$^2$) on the vertical axis. FIG. 6 indicates that the light-emitting devices of Examples 1 and 2 exhibit a luminance of, for example, close to 1,000 cd/m$^2$ when driven at 4 to 5 V. These values show that the light-emitting devices of Examples 1 and 2 are able to be driven at low voltage in comparison with the light-emitting device of Comparative Example 2 exhibiting a luminance of close to 1,000 cd/m$^2$ when driven at approximately 15 V. FIG. 6 also indicates that the light-emitting device of Example 1 exhibits a luminance as high as 3,243 cd/m$^2$ when driven at 6.2 V and exhibits a very high luminance of no less than 2,500 cd/m$^2$, which is equivalent to 5 to 10 times the luminance of the light-emitting device of Comparative Example 2, when driven at 5.2 to 7.6 V, a voltage range that encompasses 6.2 V.

FIG. 7 shows the applied voltage (V) on the horizontal axis and the current density (mA/cm$^2$) on the vertical axis. FIG. 7 indicates that the light-emitting devices of Examples 1 and 2 exhibit a very large rate of increase of current density with respect to voltage in comparison with the light-emitting device of Comparative Example 2.

FIGS. 4 to 7 clearly demonstrate that the light-emitting devices of Examples 1 and 2 exhibit high luminance and high luminous efficiency in comparison with the light-emitting devices of Comparative Examples 1 and 2 when driven at approximately the same voltage.

Various characteristics have been evaluated as an indicator in the examples of the present embodiment in view of C/Ni element ratio. When the metal oxide in the hole transport layer includes a plurality of metal compounds, the ratio of carbon atoms with respect to the sum of metal atoms in each metal oxide is used.

While there have been described what are at present considered to be certain embodiments of the invention, it will be understood that various modifications may be made thereto, and it is intended that the appended claims cover all such modifications as fall within the true spirit and scope of the invention.

The invention claimed is:
1. A light-emitting device comprising:
an anode;

a cathode;
a light-emitting layer between the anode and the cathode; and
a hole transport layer between the anode and the light-emitting layer, the hole transport layer containing carbon and a metal oxide in a prescribed and adjusted ratio, wherein
the hole transport layer contains carbon in an atomic ratio of 1.5% to 6.0%, both inclusive, relative to metal atoms.

2. The light-emitting device according to claim 1, wherein the light-emitting layer primarily contains quantum dots.

3. The light-emitting device according to claim 1, wherein the metal oxide primarily contains any of NiO, LaNiO$_3$, Cr$_2$O$_3$, Ni$_{1-x}$Mg$_x$O and Cu$_2$O.

4. The light-emitting device according to claim 1, wherein the hole transport layer has a carbon concentration being constant in a thickness direction thereof.

5. The light-emitting device according to claim 1, wherein the hole transport layer has a carbon concentration increasing in a thickness direction thereof toward the light-emitting layer.

6. The light-emitting device according to claim 1, the light-emitting device further comprising an electrical insulation film adjacent to the light-emitting layer.

7. The light-emitting device according to claim 6, wherein the electrical insulation film contains any of Al$_2$O$_3$, SiO$_2$, MgO, and ZrO$_2$.

8. The light-emitting device according to claim 6, wherein the electrical insulation film has a thickness of 1 nm to 3 nm, both inclusive.

9. A light-emitting device comprising:
an anode;
a cathode;
a light-emitting layer between the anode and the cathode; and
a hole transport layer between the anode and the light-emitting layer, the hole transport layer containing carbon and a metal oxide in a prescribed and adjusted ratio, wherein
the hole transport layer has a carbon concentration increasing in a thickness direction thereof toward the light-emitting layer.

10. The light-emitting device according to claim 9, wherein the light-emitting layer primarily contains quantum dots.

11. The light-emitting device according to claim 9, wherein the hole transport layer contains carbon in an atomic ratio of 2.1% to 4.2%, both inclusive, relative to metal atoms.

12. The light-emitting device according to claim 9, wherein the metal oxide primarily contains any of NiO, LaNiO$_3$, Cr$_2$O$_3$, Ni$_{1-x}$Mg$_x$O, and Cu$_2$O.

13. The light-emitting device according to claim 9, the light-emitting device further comprising an electrical insulation film adjacent to the light-emitting layer.

14. A light-emitting device comprising:
an anode;
a cathode;
a light-emitting layer between the anode and the cathode; and
an electron transport layer between the cathode and the light-emitting layer, the electron transport layer containing carbon and a metal oxide in a prescribed and adjusted ratio, wherein
the electron transport layer contains carbon in an atomic ratio of 1.5% to 6.0%, both inclusive, relative to metal atoms.

15. The light-emitting device according to claim 14, wherein the light-emitting layer primarily contains quantum dots.

16. The light-emitting device according to claim 14, wherein the metal oxide primarily contains any of ZnO, Zn$_{1-x}$Mg$_x$O, TiO$_2$, SnO$_2$, Ta$_2$O$_3$, and SrTiO$_3$.

17. The light-emitting device according to claim 14, wherein the electron transport layer has a carbon concentration increasing in a thickness direction thereof toward the light-emitting layer.

18. The light-emitting device according to claim 14, further comprising an electrical insulation film adjacent to the light-emitting layer.

19. The light-emitting device according to claim 18, wherein the electrical insulation film contains any of Al$_2$O$_3$, SiO$_2$, MgO, and ZrO$_2$.

20. The light-emitting device according to claim 18, wherein the electrical insulation film has a thickness of 1 nm to 3 nm, both inclusive.

\* \* \* \* \*